United States Patent
Osborn (12)

(10) Patent No.: US 6,418,552 B1
(45) Date of Patent: Jul. 9, 2002

(54) METHOD AND APPARATUS FOR OPTIMIZING TRACE LENGTHS TO MAXIMIZE THE SPEED OF A CLOCKED BUS

(75) Inventor: Daniel D Osborn, Fort Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/458,375

(22) Filed: Dec. 10, 1999

(51) Int. Cl.$^7$ .............................................. G06F 17/50
(52) U.S. Cl. ............................ 716/15; 716/12; 716/13; 716/14
(58) Field of Search ........................... 716/1–18, 6, 15; 713/501, 503; 327/91, 141, 152, 160, 172, 231, 261, 271–272, 276–277, 291–294; 331/49; 340/825.21

(56) References Cited

U.S. PATENT DOCUMENTS

| | | | |
|---|---|---|---|
| 5,467,040 A | * | 11/1995 | Nelson ........................ 327/276 |
| 6,014,508 A | * | 1/2000 | Christian et al. .............. 716/13 |
| 6,167,528 A | * | 12/2000 | Arcoleo ....................... 713/501 |

* cited by examiner

Primary Examiner—Matthew Smith
Assistant Examiner—Naum B Levin

(57) ABSTRACT

The present invention provides a method and apparatus for selecting trace lengths for a bus of a mounting surface, such as, for example, a printed circuit board (PCB), and for selecting the relative locations of two or three ICs on the mounting surface, which will be referred to hereinafter as a PCB. The method of the present invention utilizes information relating to the trace lengths of the buses of the ICs at issue and certain timing parameters of the ICs to determine optimal trace lengths for the PCB bus and the appropriate relative locations for the ICs on the PCB. An offset is then inserted into the global clock of the PCB bus to optimize the setup margins of the ICs. Optimization of the setup margins maximizes the speed of the PCB bus. The apparatus of the present invention is a computer that performs the method of the present invention. The computer receives the information relating to the trace lengths and the timing parameters of the ICs and processes the information to determine the optimal trace lengths of the PCB bus and the appropriate relative locations at which the ICs are to be placed on the PCB. The computer then determines the offset that is to be inserted into the global clock of the PCB bus to optimize the setup margins of the ICs while avoiding violating the hold times. Once the setup margins have been optimized, the clock speed can be increased to consume the setup margins, thereby increasing the overall speed of the bus.

39 Claims, 6 Drawing Sheets

METHOD AND APPARATUS FOR OPTIMIZING TRACE LENGTHS TO MAXIMIZE THE SPEED OF A CLOCKED BUS

TECHNICAL FIELD OF THE INVENTION

The present invention relates to printed circuit board (PCB) design and, more particularly, to a method and apparatus for optimizing the trace lengths of the PCB bus, which is a globally-clocked bus, to thereby maximize the speed of the bus.

BACKGROUND OF THE INVENTION

A typical PCB comprises several electrical components, such as, for example, microprocessors, memory elements and interface components, which communicate with each other via a globally clocked bus of the PCB. When ICs are designed, the IC designer sometimes increases the lengths of certain traces, or routes, from the pads of the die of the IC to the pins of the IC in order to equalize the lengths of the traces. The traces are conductive paths that comprise the bus of the IC package. Increasing certain trace lengths ensures that the signals traveling on the traces require the same amount of time to travel from the die to their respective pins, and vice versa.

When the PCB designer designs the PCB, the PCB designer sometimes increases the lengths of certain traces of the PCB bus in order to provide all of the traces of the PCB bus with equal lengths. However, the PCB and the IC design processes are performed independent of one another. Although the PCB designer typically utilizes the timing specifications of the IC packages in designing the PCB, these specifications normally do not provide information regarding the individual trace lengths within the IC package. Therefore, the PCB designer typically adds trace lengths to the PCB bus without having knowledge about the individual trace lengths of the IC package, which may not result in the best overall optimization of the PCB bus.

FIG. 1A is a block diagram of two different ICs 1 and 2 that are located on a PCB (not shown) and that communicate with each other via a PCB bus 3. The bus 3 is a globally clocked bus. The ICs 1 and 2 are "different" in that they at least have different timing parameters (e.g., setup and hold times, clock-to-Q, etc.). FIG. 1B is a more detailed illustration of the ICs 1 and 2 and the PCB bus 3 shown in FIG. 1A. IC 1 has a die 4 and each signal is routed from a particular location on the die 4 to one of the pins 5. The signals are routed by traces 6 that connect the particular locations on the die to respective pins 5. The locations at which the traces or wire bonds are connected on the die 4 typically correspond to bus drivers (not shown). The pins 5 on IC 1 are connected to IC 2 at respective pins 8 of IC 2 via traces 9 of the PCB bus 3. The pins 8 are connected to particular locations on the die 11 of IC 2 by traces 12 of the IC 2.

As stated above, the PCB board designer typically does not utilize information relating to the lengths of the traces 6 and 12 of the ICs 1 and 2, respectively. Therefore, adding trace lengths to the PCB bus traces 9 in order to equalize the lengths of the traces 9 may not result in optimization of the PCB bus 3 because doing so will not necessarily equalize the pad-to-pad trace lengths, i.e., the routing distances between the locations on the die 4 at which the traces 6 are connected and the locations on the die 11 at which the traces 12 are connected.

It would be desirable to provide a method for designing a PCB that takes into account the effects of the trace lengths within the IC packages and the timing parameters of the IC packages (e.g., setup-and-hold time, clocked Q, etc.) in determining the trace lengths of the PCB bus and the locations at which the ICs are to be placed on the PCB. By taking these factors into account in designing the PCB, the optimum placement of the ICs and the optimum trace lengths of the PCB bus can be selected, thereby allowing the speed of the PCB bus to be maximized.

Accordingly, a need exists for a method and apparatus for optimizing trace lengths of the PCB bus and for optimizing placement of the ICs on the PCB to thereby enable the speed of the PCB bus to be maximized.

SUMMARY OF THE INVENTION

The present invention provides a method and apparatus for selecting trace lengths for a bus of a mounting surface, such as, for example, a printed circuit board (PCB), and for selecting the relative locations of two or three ICs on the mounting surface, which will be referred to hereinafter as a PCB. The method of the present invention utilizes information relating to the trace lengths of the buses of the ICs at issue and certain timing parameters of the ICs to determine optimal trace lengths of the PCB bus and the appropriate relative locations for the ICs on the PCB. An offset is then inserted into the global clock of the PCB bus to optimize the setup margins of the ICs. Optimization of the setup margins maximizes the speed of the PCB bus. The apparatus of the present invention is a computer that performs the method of the present invention. The computer receives the information relating to the trace lengths and the timing parameters of the ICs and processes the information to determine the appropriate trace lengths of the PCB bus and the appropriate relative locations at which the ICs are to be placed on the PCB. The computer then determines the offset that is to be inserted into the global clock of the PCB bus to optimize the setup margins of the ICs.

In accordance with the preferred embodiment of the present invention, for each signal of the ICs, the combined package delays are calculated and a determination is made as to which signal corresponds to the longest combined package delay. The relative locations of the ICs are then selected such that the signal corresponding to the longest combined package delay is routed the shortest possible distance between the ICs. The pad-to-pad flight times for all of the signals are then calculated assuming that all other signals are routed the shortest possible distances between the ICs given the selected placement of the ICs. The worst case pad-to-pad flight time is then determined and the ICs are relocated such that the signal corresponding to the worst case pad-to-pad flight time is routed the shortest possible distance between the ICs. The trace lengths for all other signals are then set so that their respective pad-to-pad flight times are equal to the worst case pad-to-pad flight time. An offset is then inserted in the global clock of the PCB bus so that the setup margins of the ICs are optimized, thereby maximizing the speed of the PCB bus.

Other features and advantages of the present invention will become apparent from the following description, drawings and claims.

DETAILED DESCRIPTION OF THE INVENTION

Figure 2:
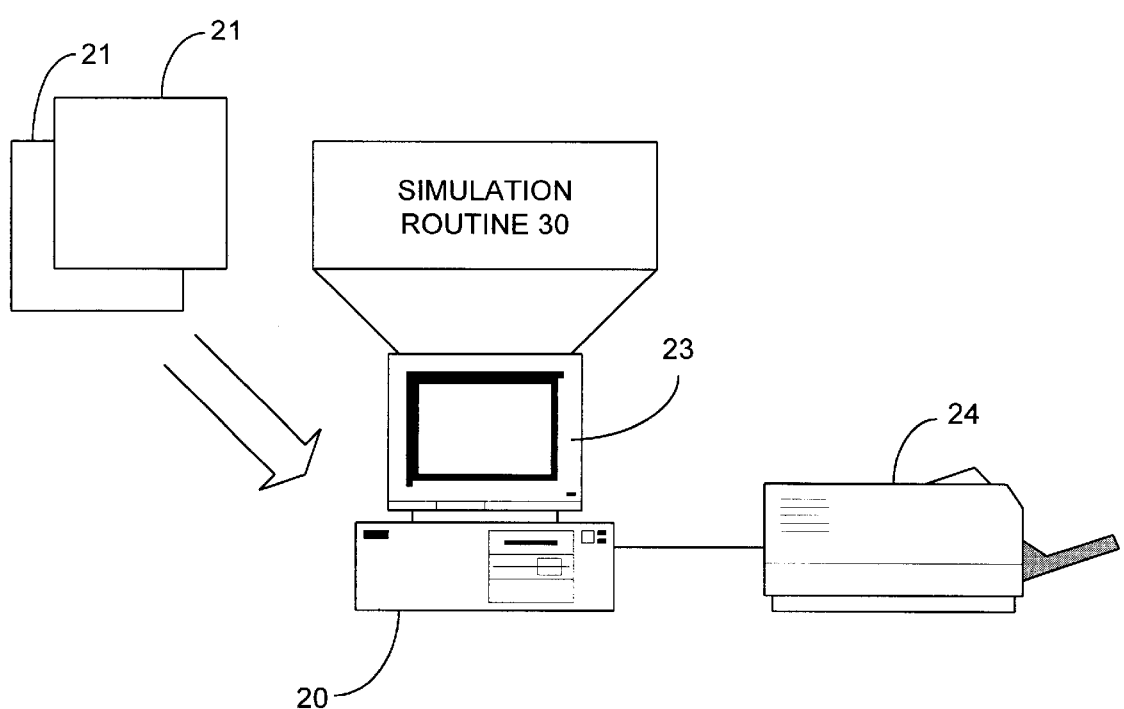
FIG. 2 is an illustration of the apparatus of the present invention in accordance with the preferred embodiment.

FIG. 2 illustrates the apparatus of the present invention in accordance with the preferred embodiment. The apparatus of the present invention comprises a computer 20, which receives one or more files 21 that contain information relating to the individual trace lengths and the timing parameters of two or more ICs that are to be mounted on a mounting surface (not shown), such as, for example, a printed circuit board (PCB) (not shown). The timing parameters preferably are the setup and hold times of the ICs and the clock-to-Q parameter. The computer 20 utilizes this information and performs various computations to determine the appropriate relative positions of the ICs on the PCB and the appropriate trace lengths of the PCB bus. The computer 20 then uses this information to calculate an offset to be inserted into the global clock of the PCB bus.

The computer 20 may be in communication with a display device 23 that displays the results of the computations to enable a PCB designer (not shown) to utilize the results to mount the ICs at the appropriate locations on the PCB, to appropriately route the traces of the PCB bus and to insert the offset into the global clock of the PCB. The computer 20 may also be in communication with a printer 24 to enable the PCB designer to print out the results. The computer 20 performs the aforementioned tasks by executing software, namely, a simulation routine 30, that simulates a PCB having ICs located at certain positions and calculates the trace lengths of the PCB bus, the pad-to-pad trace lengths for all signals (i.e., all pins of the ICs), the pad-to-pad flight times for all signals, the optimum positioning of the ICs on the PCB, the final routing design of the PCB bus traces and the appropriate offset to be inserted into the global clock of the PCB bus. The manner in which the computer 20 performs these tasks will be discussed below in detail with reference to FIGS. 3 and 7.

However, it should be noted that it is not necessary for the method of the present invention to be performed by a computer. The method of the present invention may also be performed by a human being who performs the necessary calculations to determine the appropriate positioning of the ICs on the PCB, the appropriate routing of the PCB bus traces and the appropriate offset to be inserted into the global clock of the PCB bus. However, due to the large number of calculations that must be performed, the method of the present invention preferably is performed with the aid of a computer. It should also be noted that the method of the present invention could be performed in part by the computer 20 and in part by a human being, such as the PCB designer.

Figure 3:
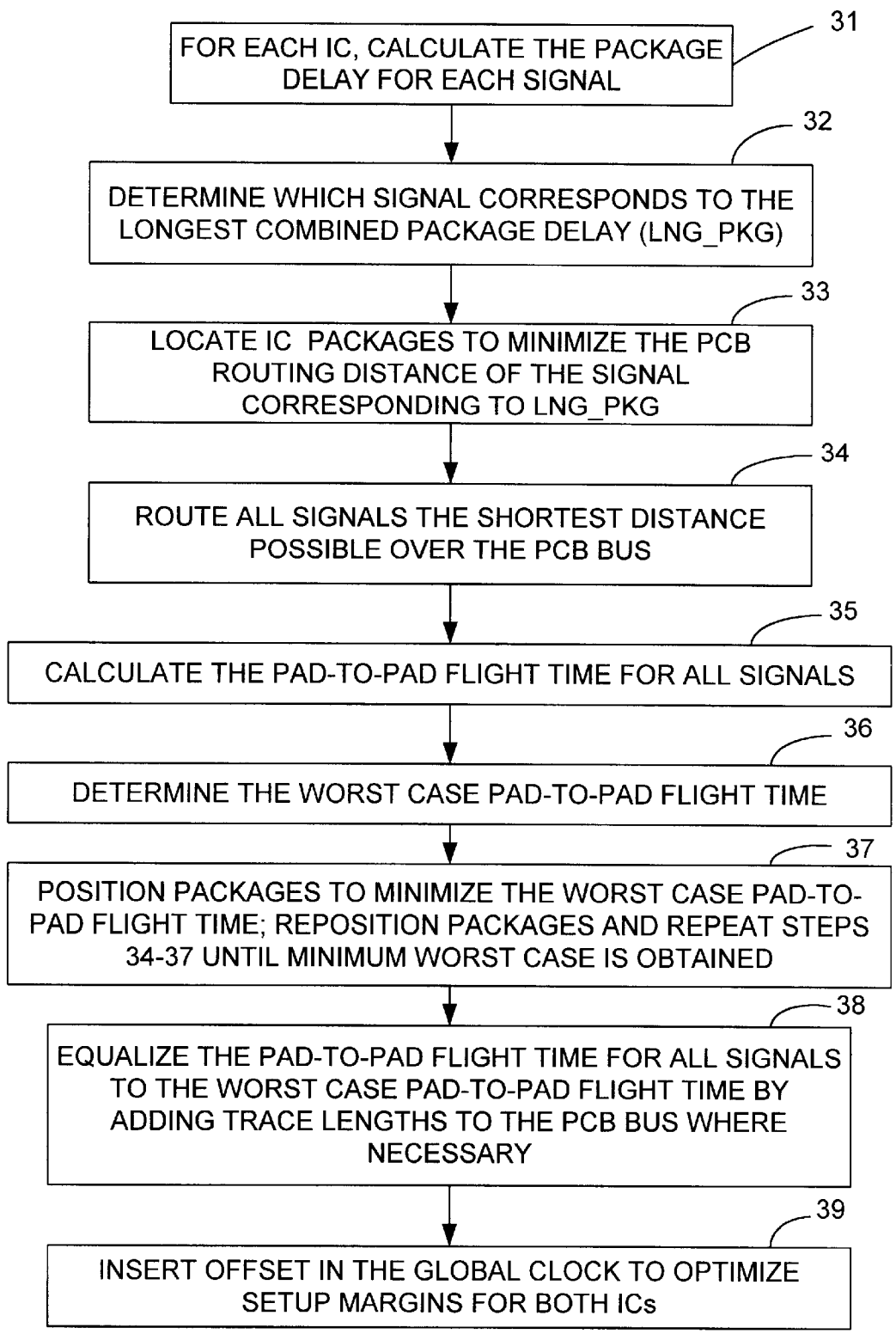
FIG. 3 is a flow chart illustrating the method of the present invention in accordance with a first embodiment.

The flow chart shown in FIG. 3 represents the software program 30 that performs the method of the present invention. The software program 30 preferably utilizes information generated by the PCB designer who uses a computer aided design (CAD) program to design the PCB. In accordance with the first embodiment of the present invention, the computer 20 determines the appropriate relative locations of two different ICs, such as those shown in FIG. 1B, and the appropriate trace routing for the PCB bus, such as the PCB bus traces 9 shown in FIGS. 1A and 1B. The computer 20 then determines the offset to be inserted into the global clock based on the selected positions of the ICs and the selected trace routing of the PCB bus. The manner in which these tasks are performed in accordance with the first embodiment will now be described in detail with reference to FIG. 3.

For each IC, the package delay for each signal is calculated, as indicated by block 31. Each pin of the IC corresponds to a particular signal. The package delay relates to the length of the trace of the IC that connects the die of the IC to the pin. The files 21 contain information that describes the IC delays for each signal. The information contained in the files 21 may be gathered in a number of ways, as will be understood by those skilled in the art. The information may be obtained from the IC designer or it may be derived from information obtained from the IC designer and/or from the IC design specifications. Those skilled in the art will understand the manner in which such information may be gathered and placed in a form that is suitable for processing by the computer 20. The present invention is not limited with respect to the manner in which the files are generated and/or inputted into the computer 20.

Once the signal delays for each of the ICs have been obtained, the combined package delays for each signal are calculated. For example, the delay associated with signal A in IC 1 will be combined with the delay associated with signal A in IC 2. This calculation will be performed for all signals and a determination will be made as to which signal corresponds to the longest combined package delay, as indicated by block 32. The signal corresponding to the longest combined package delay, LNG_PKG, will then be used to orient the IC packages. Specifically, the IC packages will be positioned such that the routing distance from the pins associated with this signal to the PCB bus will be minimized, as indicated by block 33.

All of the signals for each of the ICs will then be routed the shortest distances possible from the pins to the PCB bus, as indicated by block 34. Steps 33 and 34 preferably are performed by the PCB designer using a CAD program. Therefore, the computer 20 may import a file 21 generated by the CAD program that contains all of the routing information. The computer then uses this information to calculate the pad-to-pad flight times for all of the signals, as indicated by block 35. The pad-to-pad flight time corresponds to the amount of time that it takes a signal to travel from the pad of the die of one IC to the pad of the die of another IC. Since the lengths of the PCB bus traces and the lengths of the IC bus traces are known, the pad-to-pad flight times can be easily calculated, as will be understood by those skilled in the art. The computer 20 compares all of the pad-to-pad flight times and determines which of the flight times is the longest, which corresponds to the worst case pad-to-pad flight time. This step is represented by block 36.

Once the worst case pad-to-pad flight time has been calculated, the ICs are positioned so as to minimize the worst case pad-to-pad flight time, as indicated by block 37. The IC packages are repositioned and steps 34–37 are repeated until the minimum worst case pad-to-pad flight time has been obtained. For example, steps 34–37 may be performed 10 times and each time it is performed, the pad-to-pad flight times for all signals are calculated. Once the minimum worst case pad-to-pad flight time has been obtained, the ICs will be positioned relative to one another in the positions corresponding to the minimum worst case pad-to-pad flight time. All of the other traces of the PCB bus will be provided with lengths that make their pad-to-pad flight times equal to the worst case pad-to-pad flight time, as indicated by block 38.

This latter step is somewhat counter intuitive in that it would seem that adding lengths to the traces would decrease the overall speed of the PCB bus. However, as stated above, one technique that has been used in the past to optimize the PCB bus was to minimize the lengths of all of the traces of the PCB bus. However, due to the different timing parameters of the ICs, minimizing the lengths of all of the traces may not result in optimization of the PCB bus, whereas adding lengths to all or some of the traces may optimize the PCB bus, as discussed in more detail below with reference to FIGS. 4 and 5. In accordance with the present invention, the traces are optimized in length to thereby equalize the pad-to-pad flight times and then an offset is inserted into the clock in order to optimize the setup margins for each of the ICs.

Each of the ICs has a setup time, a hold time and a clock-to-Q time. The setup time is the amount of time that a signal must be present at a receiver pad of an IC before the clock signal arrives. The hold time is the amount of time that a signal must remain at the receiver pad of the IC after the clock signal arrives. Each IC also has a setup margin associated with it. The setup margin is the amount of excess setup time that exists, i.e., the amount of time in excess of the setup time that the signal is available at the receiver pad of the IC before the clock signal arrives. The speed of the bus is limited by the speed of the global clock of the PC bus, which, in turn, is limited by the setup times of the ICs. In other words, although increasing the speed of the clock generally increases the speed of the PCB bus, the clock cannot be increased to the point where it violates the setup and hold times of the ICs.

In accordance with the present invention, it has been determined that the setup margin of one of the ICs can be decreased while increasing the setup margin of the other IC and that the clock signal being delivered to one of the ICs can be offset by a predetermined amount, thereby optimizing the setup margins for both ICs. The clock period may then be decreased to an extent that some or all of the setup margin is consumed while also ensuring that the setup and hold times of the ICs are not violated. The manner in which this is accomplished will now be described with reference to FIGS. 4 and 5.

Figure 1A:
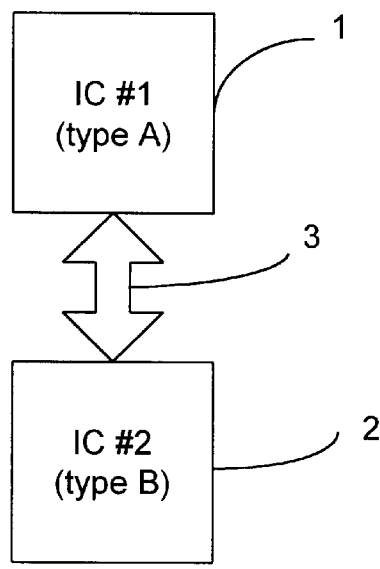
FIG. 1A is a block diagram of two different ICs that are in communication with each other via a bus of a printed circuit board (PCB).
Figure 1B:
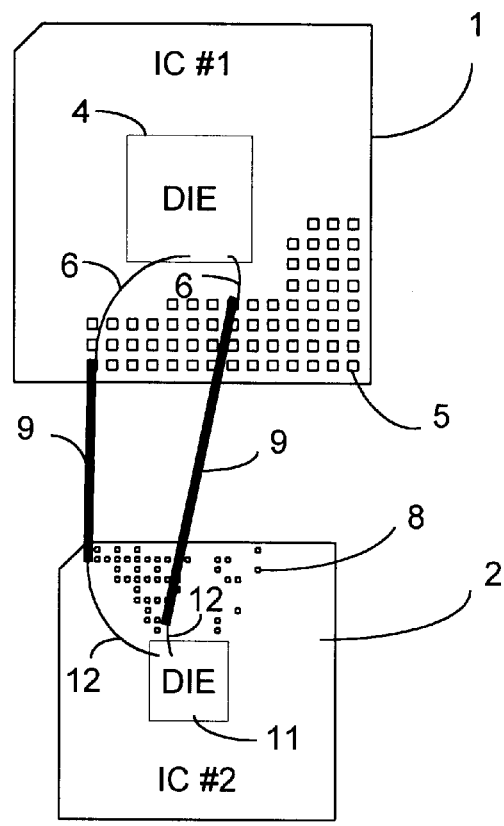
FIG. 1B is a more detailed illustration of the arrangement shown in FIG. 1A, which illustrates the bus traces of the ICs and of the PCB bus.
Figure 4:
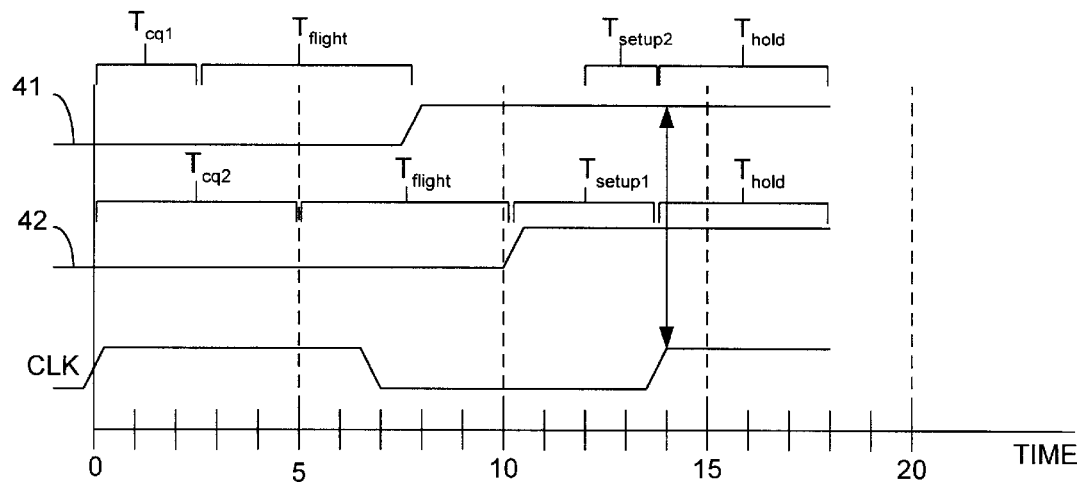
FIG. 4 is a timing diagram illustrating the timing of signals transmitted between the ICs shown in FIGS. 1A and 1B before an offset has been inserted in the global clock of the PCB bus.

FIG. 4 is a timing diagram that illustrates the timing of signals being transmitted between two ICs, such as ICs 1 and 2 shown in FIGS. 1A and 1B, and the timing of the PCB bus global clock signal, which has not been offset. The timing diagram will be discussed with reference to FIGS. 1A and 1B. The vertical axis corresponds to the magnitude of the signals in volts and the horizontal axis corresponds to time in nanoseconds (ns). The time units used are not necessarily accurate and are used merely to demonstrate the principles of the present invention. Also, the relative timing of the signals is not necessarily accurate, but is being used to illustrate the manner in which the setup margins can be optimized.

The signal 41 corresponds to a signal transmitted from IC 1 to IC 2. The signal 42 corresponds to a signal transmitted from IC 2 to IC 1. The signal CLK is the global clock signal of the PCB bus. The time $T_{cq1}$ is the clock-to-Q time associated with IC 1. The time $T_{cq2}$ is the clock-to-Q time associated with IC 2. The time $T_{flight}$ is the amount of time that it takes for a signal to travel from the driver pad of one of the ICs over the PCB bus to the receiver pad of the other IC. The time $T_{hold}$ is the hold time for ICs 1 and 2, which are shown as being equal, but this is not necessarily required.

The time $T_{cq1}$ can be added to the flight time $T_{flight}$ to obtain the total amount of time that is required from the time that the clock signal CLK arrives at IC 1 for the signal 41 to be received at the receiver pad of IC 2. The instant at which the signal 41 arrives at the receiver pad of IC 2 is represented by the transition in the signal 41 from low to high. The signal 41 arrives at the receiver pad at 8 nanoseconds (ns). The setup time for IC 2 begins 2 ns before the clock signal goes high again, which corresponds to 12 ns on the horizontal axis. Therefore, a setup margin of 4 ns exists for IC 2. In other words, the signal 41 is available at the receiver pad 4 ns before it must be available at the receiver pad.

In contrast, IC 2 has a longer $T_{cq2}$ than IC 1. Consequently, the signal is available at the receiver pad of IC 1 only approximately 4 ns before the clock signal goes high again. Also, the setup time for IC 1 is greater than the setup time for IC 2. Therefore, IC 1 has no setup margin. In other words, the signal 42 arrives at the receiver pad of IC 1 precisely when it must arrive in order to avoid violating the setup time of IC 1. Since the IC 1 has no setup margin, the clock period cannot be shortened without violating the setup time of IC 1. Therefore, increasing the speed of the PCB bus by increasing the clock speed is not an option.

Figure 5:
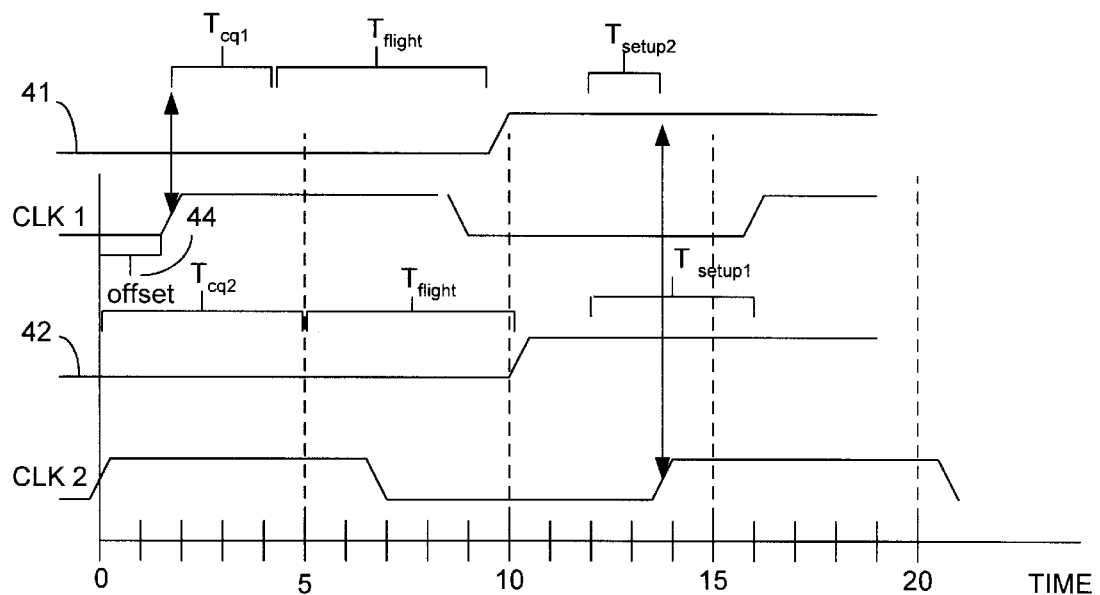
FIG. 5 is a timing diagram illustrating the timing of signals transmitted between the ICs shown in FIGS. 1A and 1B after an offset has been inserted in the global clock of the PCB bus to optimize the setup margins of the ICs.

The timing diagram of FIG. 5 demonstrates the manner in which the present invention can be used to optimize the setup margins of the ICs once the pad-to-pad flight times have been equalized. The signals shown in FIG. 5 are the same as the signals shown in FIG. 4 except that an additional clock signal CLK 1 has been added, which is the clock signal received by IC 1. The clock signal CLK 2 shown in FIG. 5 corresponds to the clock signal CLK shown in FIG. 4, which correspond to the global clock signal of the PCB bus. The clock signal CLK 2 is derived from the global clock and is delivered to IC 2, but has an offset 44 inserted therein. In this case, the offset corresponds to a delay of the global clock signal. However, the offset could instead correspond to a forward shift in time of the global clock signal.

By delaying the clock signal, the setup margin of IC 2 is decreased to 2 ns because the signal 41 arrives at the receiver pad of IC 2 at 10 ns and it must be present at the receiver pad of IC 2 at 12 ns, or 2 ns before the clock signal CLK 2 is delivered to IC 2. However, the signal 42 being delivered to IC 1 is now received at the receiver pad of IC 1 2 ns before must be present at the receiver pad of IC 1. Therefore, both ICs now have an equal setup margin of 2 ns. Therefore, the clock period can be shortened by 2 ns without violating the setup times of ICs 1 and 2, thus increasing the speed of the PCB bus. The step of equalizing the pad-to-pad flight times in step 38 of FIG. 3 ensures that increasing the clock speed in this manner will not result in violating the setup or hold times of any one signal while other signals have excess setup margins. The offset that is inserted into the clock preferably is produced be either increasing or decreasing the trace length that delivers the clock signal to the IC. However, those skilled in the art will understand that other techniques may be used to accomplish this task.

Figure 6:
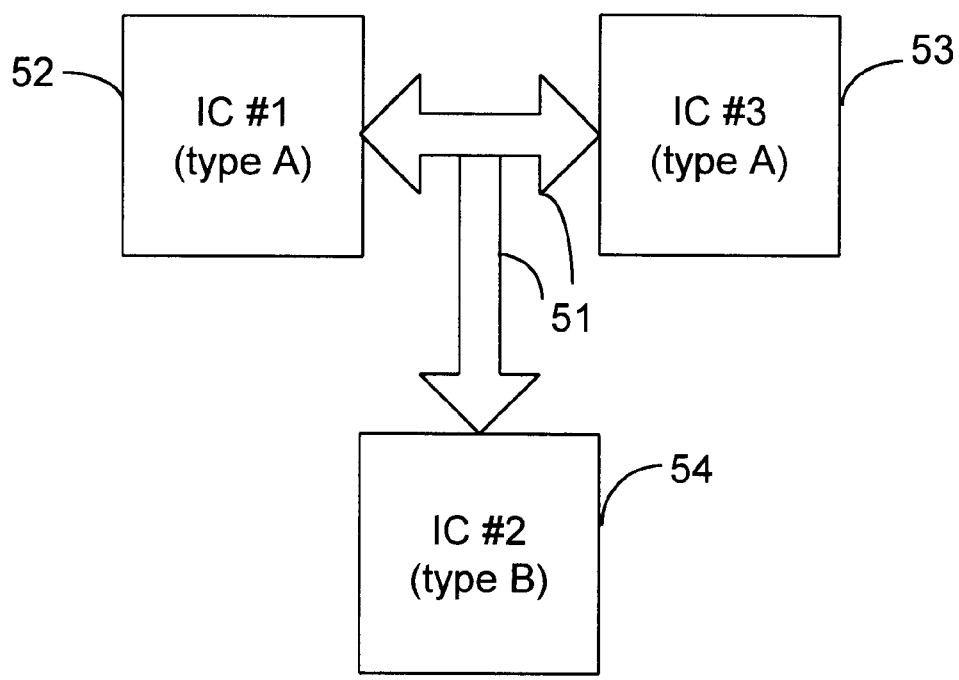
FIG. 6 is a block diagram of three ICs that are in communication with each other via a bus of a printed circuit board (PCB).
Figure 7:
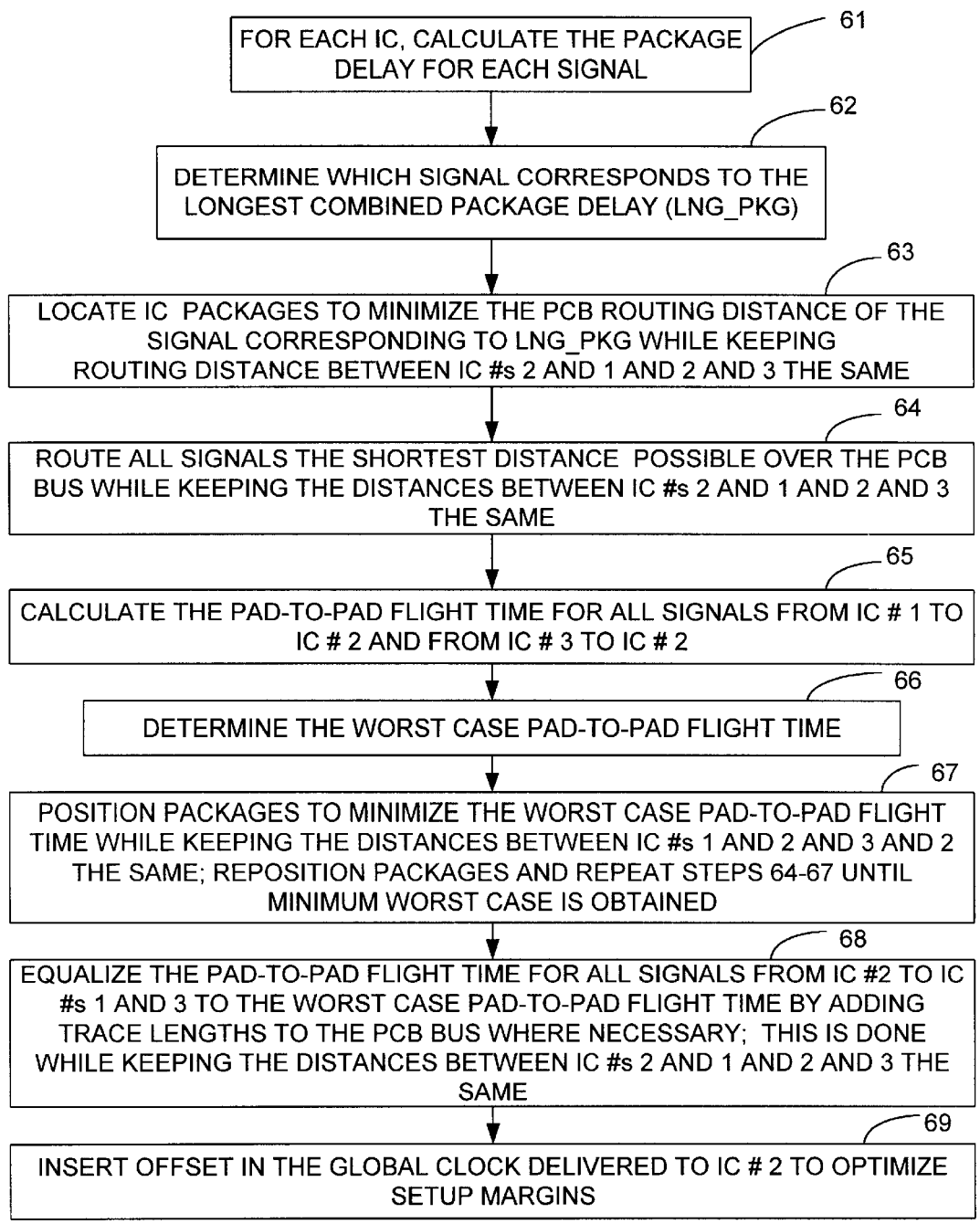
FIG. 7 is a flow chart illustrating the method of the present invention in accordance with a second embodiment.

FIG. 6 is a block diagram of three ICs that are in communication with each other via the PCB bus 51. Two of the ICs, namely ICs 52 and 53, are identical, at least in terms of their timing parameters (i.e., setup and hold times, clock-to-Q time and package delay) and pinout. IC 54 is different from the ICs 52 and 53, at least in terms of the aforementioned timing parameters. FIG. 7 is a flow chart illustrating the manner in which a second embodiment of the present invention can be used to optimize the PCB bus when such an arrangement of ICs must be considered. For ease of discussion, the ICs 52, 53 and 54 will be referred to as IC #s 1, 3 and 2, respectively. Therefore, IC #s 1 and 3 are the same and IC #2 is different.

The steps are very similar to those shown in FIG. 3, except that they have been varied to take into account a third IC. The first step is to calculate the package delay for each signal being transmitted between IC #s 1 and 2 and between IC #s 3 and 2, as indicated by block 61. The ICs will be positioned so that the trace lengths of the PCB bus between IC #s 1 and 2 and between IC #s 3 and 2 are equal. Therefore, a determination as to the package delays only needs to be made for signals transmitted between either IC #s 1 and 2 or between IC #s 3 and 2.

A determination is then made as to which signal corresponds to the longest combined package delay, as indicated by block 62. This signal will be referred to herein as LNG_PKG. The ICs are then positioned so that the PCB routing distance is minimized for the signal corresponding to LNG_PKG, as indicated by block 63. However, the routing distances between IC #s 1 and 2 and between IC #s 3 and 2 will be kept the same during this step. All signals are then routed the shortest distances possible over the PCB bus, as indicated by block 64. The pad-to-pad flight times for all signals transmitted between IC #s 1 and 2 or between IC #s 2 and 3 are then determined, as indicated by block 65. The pad-to-pad flight times are then compared to determine the worst case (i.e., the longest) pad-to-pad flight time, as indicated by block 66.

Once the worst case pad-to-pad flight time has been determined, the ICs are positioned so that the minimum worst case pad-to-pad flight time is obtained, while keeping the routing distances between IC #s 1 and 2 and between IC #s 3 and 2 equal, as indicated by block 67. The ICs are then repositioned and steps 64–67 are repeated a plurality of times if necessary until the relative positioning of the ICs results in the minimum worst case pad-to-pad flight time. The pad-to-pad flight times for all of the signals are then equalized by adding trace lengths where necessary so that all of the pad-to-pad flight times are made substantially equal to the worst case pad-to-pad flight time. An offset is then inserted into the global clock delivered to IC #2, since IC #2 presumably has a setup margin that is different from that of IC #s 1 and 3. The offset is determined in the manner discussed above with respect to FIG. 5. Once the offset has been inserted, all of the ICs will have the same setup margins and the clock speed can be increased to the extent that the setup margins are consumed without violating the setup and/or hold times of the ICs.

It should be noted that the present invention has been described with respect to the preferred embodiments of the present invention and that the present invention is not limited to these embodiments. It will be understood that modifications can be made to the present invention that are within the scope of the present invention.

What is claimed is:

1. An apparatus for optimizing traces of a bus of a mounting surface, the mounting surface being adapted for mounting at least first and second integrated circuits (ICs) thereon, each of the integrated circuits having a plurality of pins, each pin of an integrated circuit (IC) corresponding to a particular signal of the integrated circuit, each pin being conductively coupled by a conductive trace to the bus of the mounting surface, the apparatus comprising:

first logic configured to determine a pad-to-pad flight time associated with each signal and to determine which pad-to-pad flight time is the greatest pad-to-pad flight time;

second logic configured to compute a trace route for the signal associated with the greatest pad-to-pad flight time, the trace route corresponding to a route of a trace of the bus, the trace conductively coupling the pin of the first IC associated with the greatest pad-to-pad flight time to the pin of the second IC associated with the greatest pad-to-pad flight time;

third logic configured to compute a trace route for all signals other than the signal associated with the greatest pad-to-pad flight time, the computed trace routes for all of said other signals having lengths that provide said all other signals with pad-to-pad flight times that are equal to the greatest pad-to-pad flight time; and fourth logic configured to calculate an offset to be produced in a clock signal provided to one of the ICs, the offset causing setup margins associated with the first and second ICs to be equal.

2. The apparatus of claim 1, further comprising:

fifth logic configured to calculate a new clock speed based on the equal setup margins of the ICs.

3. The apparatus of claim 2, wherein said first, second, third, fourth and fifth logic are comprised by a computer that is programmed with software that causes the computer to perform the tasks associated with the first, second, third, fourth and fifth logic when the software is executed by the computer.

4. The apparatus of claim 3, wherein the mounting surface is a printed circuit board (PCB).

5. An apparatus for optimizing traces of a bus of a mounting surface, the mounting surface being adapted for mounting at least first, second and third integrated circuits (ICs) thereon, each of the integrated circuits having a plurality of pins, each pin of an integrated circuit (IC) corresponding to a particular signal of the integrated circuit, each pin being conductively coupled by a conductive trace to the bus of the mounting surface, the first and second ICs having identical setup margins and the third IC having a setup margin that is different from the setup margins of the first and second ICs, the apparatus comprising:

first logic configured to determine a pad-to-pad flight time associated with each signal transmitted between the first and third ICs and to determine which pad-to-pad flight time is the greatest pad-to-pad flight time;

second logic configured to compute a trace route for the signal associated with the greatest pad-to-pad flight time, the trace route corresponding to a route of a trace of the bus, the trace conductively coupling the pin of the first IC associated with the greatest pad-to-pad flight time to the pin of the third IC associated with the greatest pad-to-pad flight time;

third logic configured to compute a trace route for all signals transmitted between the first and third ICs other than the signal associated with the greatest pad-to-pad flight time, the computed trace routes for all of said other signals having lengths that provide said all other signals with pad-to-pad flight times that are equal to the greatest pad-to-pad flight time, the third logic computing trace routes for all signals transmitted between the second and third ICs, the trace routes for any signal transmitted between the second and third ICs having the same length as the trace routes for an associated signal transmitted between the first and third ICs; and fourth logic configured to calculate an offset to be produced in a clock signal provided to the third IC, the offset causing setup margins associated with the first, second and third ICs to be equal.

6. The apparatus of claim 5, further comprising:

fifth logic configured to calculate a new clock speed based on the equal setup margins of the ICs.

7. The apparatus of claim 6, wherein said first, second, third, fourth and fifth logic are comprised by a computer that is programmed with software that causes the computer to perform the tasks associated with the first, second, third, fourth and fifth logic when the software is executed by the computer.

8. The apparatus of claim 7, wherein the mounting surface is a printed circuit board (PCB).

9. An apparatus for optimizing traces of a bus of a mounting surface, the mounting surface being adapted for mounting at least first and second integrated circuits (ICs) thereon, each of the integrated circuits having a plurality of pins, each pin of an integrated circuit (IC) corresponding to a particular signal of the integrated circuit, each pin being conductively coupled by a conductive trace to the bus of the mounting surface, the apparatus comprising:

a computer calculating a pad-to-pad flight time associated with each signal and determining which pad-to-pad flight time is the greatest pad-to-pad flight time, the computer using the determination as to the greatest pad-to-pad flight time to compute a trace route for the signal associated with the greatest pad-to-pad flight time, the trace route corresponding to a route of a trace of the bus, the trace conductively coupling the pin of the first IC that is associated with the greatest pad-to-pad flight time to the pin of the second IC that is associated with the greatest pad-to-pad flight time, the computer calculating trace routes for all of said other signals that provide said all other signals with pad-to-pad flight times that are equal to the greatest pad-to-pad flight time, the computer analyzing the setup margins to calculate an offset to be produced in a clock signal provided to one of the ICs, the offset causing setup margins associated with the first and second ICs to be equal.

10. A method for optimizing traces of a bus of a mounting surface, the traces of the bus being connected to pins of at least first and second integrated circuits (ICs), the ICs having different setup margins, the mounting surface being adapted for mounting at least first and second integrated circuits (ICs) thereon, each of the integrated circuits having a plurality of pins, each pin of an integrated circuit (IC) corresponding to a particular signal of the integrated circuit, each pin being conductively coupled by a conductive trace to the bus of the mounting surface, the method comprising the steps of:

simulating positioning the first and second ICs to minimize a largest pad-to-pad flight time;

computing a route of the bus for the signal that corresponds to the largest pad-to-pad flight time, the route corresponding to a trace of the bus;

equalizing all pad-to-pad flight times associated with all of the signals to the largest pad-to-pad flight time; and calculating an offset to be produced in a clock of the bus that is provided to the first IC.

11. The method of claim 10, wherein the step of simulating positioning the first and second ICs further comprises the steps of:

for each signal, calculating a package delay, for each signal, combining the package delay associated with the first IC with the corresponding package delay associated with the second IC to obtain a combined package delay for the signal;

determining which package delay corresponds to the longest combined package delay;

simulating locating the ICs on the mounting surface so as to minimize a routing distance between the pins of the first and second ICs that are associated with the longest combined package delay;

simulating routing all signals other than the signal associated with the longest combined package delay the shortest possible distances on the mounting surface;

determining a pad-to-pad flight time associated with each signal;

determining which pad-to-pad flight time is the greatest pad-to-pad flight time; and simulating positioning the ICs at various relative locations until the greatest pad-to-pad flight time is minimized.

12. The method of claim 11, wherein the step of simulating equalizing pad-to-pad flight times comprises the step of:

simulating adding trace lengths to the traces of the bus until all of the signals have equal pad-to-pad flight times.

13. The method of claim 12, further comprising the steps of:

offsetting the clock being provided to the first IC by an amount sufficient to equalize setup margins of the first and second ICs; and increasing the clock speed until the setup margins are substantially non-existent.

14. A method for optimizing traces of a bus of a mounting surface, the traces of the bus being connected to pins of at least first, second and third integrated circuits (ICs), the first and second ICs having identical setup margins, the third IC having a setup margin that is different from the setup margins of the first and second ICs, the mounting surface being adapted for mounting at least the first, second and third integrated circuits (ICs) thereon, each of the integrated circuits having a plurality of pins, each pin of an integrated circuit (IC) corresponding to a particular signal of the integrated circuit, each pin being conductively coupled by a conductive trace to the bus of the mounting surface, the method comprising the steps of:

simulating positioning the first, second, and third ICs to minimize a largest pad-to-pad flight time between the first and third ICs and between the second and third ICs, while maintaining substantially identical routing distances between the first and third and second and third ICs;

computing first and second routes of the bus for the signal that corresponds to the largest pad-to-pad flight time, the routes corresponding to first and second traces of the bus, the first trace corresponding to a route between the first and third ICs and the second trace corresponding to a route between the second and third ICs, the first and second traces being equal in length;

equalizing all pad-to-pad flight times associated with all of the signals; and calculating an offset to be produced in a clock of the bus that is provided to the first IC.

15. The method of claim 14, wherein the step of simulating positioning the first, second and third ICs further comprises the steps of:
  for each signal associated with the first and third ICs, calculating a package delay;
  for each signal associated with the first and third ICs, combining the package delay associated with the first IC with the corresponding package delay associated with the third IC to obtain a combined package delay for the signal;
  determining which package delay corresponds to the longest combined package delay;
  simulating locating the first and third ICs on the mounting surface so as to minimize a routing distance between the pins of the first and third ICs that are associated with the longest combined package delay, the signal of the first IC that corresponds to the longest combined package delay corresponding to a signal of the second IC;
  simulating locating the second IC on the mounting surface so as to minimize a routing distance between the pins of the second and third ICs that are associated with the longest combined package delay;
  simulating routing all signals other than the signals associated with the longest combined package delay the shortest possible distances on the mounting surface;
  determining a pad-to-pad flight time associated with each signal;
  determining which pad-to-pad flight time is the greatest pad-to-pad flight time; and
  simulating positioning the ICs at various relative locations until the greatest pad-to-pad flight time is minimized.

16. The method of claim 15, wherein the step of simulating equalizing the pad-to-pad flight times comprises the step of:
  simulating adding trace lengths to the traces of the bus until all of the signals have equal pad-to-pad flight times.

17. The method of claim 15, further comprising the steps of:
  offsetting the clock being provided to the third IC by an amount sufficient to equalize setup margins of the first, second and third ICs; and
  increasing the clock speed until the setup margins are substantially non-existent.

18. An apparatus for optimizing traces of a bus of a mounting surface having at least a first and a second Integrated Circuit (IC) thereon, said apparatus comprising:
  first logic configured to identify a signal having a first pad-to-pad flight time that is transmitted between the first and the second ICs, said first logic further configured to compute a trace route for said signal;
  second logic configured to adjust trace route length of other signals transmitted between the first and second ICs such that the other signals have pad-to-pad flight times equal to said first pad-to-pad flight time; and
  third logic configured to offset a clock signal of one of said ICs such that the setup margins of the first and second ICs are equal.

19. An apparatus as claimed in claim 18, said apparatus further comprising fourth logic configured to position said first and second ICs to minimize the length of the trace route associated with the signal having the first pad-to-pad flight time.

20. An apparatus as claimed in claim 19, said apparatus further comprising a fifth logic configured to adjust a global clock speed of the bus such that the setup margins of the ICs are minimized.

21. An apparatus as claimed in claim 20 wherein said first, second, third, fourth, and fifth logic are implemented by software on a computer.

22. An apparatus as claimed in claim 21 wherein said first and second ICs are mounted on a printed circuit board (PCB).

23. An apparatus for optimizing performance of a bus of a mounting surface having at least a first, a second, and a third IC thereon, said apparatus comprising:
  first logic configured to identify a first signal having the greatest pad-to-pad flight time that is transmitted between the first IC and the second IC and between the third IC and the second IC, said first logic further configured to compute a trace route for the signal;
  second logic configured to position the first, second, and third ICs to minimize the trace length of the signal while maintaining equal distances between said ICs;
  third logic configured to add other traces between the ICs such that pad-to-pad flight times of other signals between the first IC and the second IC and between the third IC and the second IC equal the greatest pad-to-pad flight time, while maintaining equal distances between said ICs; and
  fourth logic configured to offset a clock signal of the first IC such that the setup margins of the first and second ICs are equal.

24. The apparatus of claim 23 further comprising a fifth logic configured to adjust the clock speed of the bus based upon the setup margins of the ICs.

25. An apparatus as claimed in claim 24 wherein said first, second, third, fourth, and fifth logic are implemented by software on a computer.

26. An apparatus as claimed in claim 25 wherein said first, second, and third ICs are mounted on a printed circuit board (PCB).

27. An apparatus for optimizing traces of a bus of a mounting surface having at least a first and second IC, the apparatus comprising:
  a computer identifying the greatest pad-to-pad flight time between the first and second ICs, the computer computing a trace route for a signal associated with the greatest pad-to-pad flight time, the computer calculating trace routes for other signals associated with other pad-to-pad flight times between the first and second ICs such that the other signals pad-to-pad flight times are equal to the greatest pad-to-pad flight time, the computer analyzing the setup margins of the first and second ICs to calculate an offset to be produced in a clock signal provided to one of the ICs, the offset causing the setup margins associated with the first and second ICs to be equal.

28. A method for optimizing traces of a bus of a mounting surface, the method comprising the steps of:
  simulating a position on the mounting surface of a first IC and a second IC to minimize a largest pad-to-pad flight time associated with a signal that is transmitted between the first and second ICs;
  computing a route of the bus for the signal;
  equalizing pad-to-pad flight times associated with other signals that are transmitted between the first and second ICs to the largest pad-to-pad flight time; and calculating a clock offset for the first IC based upon the equalizing step so as to equalize setup margins of the first and second ICs.

29. The method of claim 28 wherein said simulating step further comprises the steps of:

identifying a signal transmitted between the first IC and the second IC having the longest combined package delay;

simulating the position of the first IC and the second IC so as to minimize the routing distance of the signal having the longest combined package delay;

routing all signals, other than the signal associated with the longest combined package delay, between said first IC and said second IC so as to minimize the routing distances of the routed signals.

30. The method of claim 29 wherein said equalizing step comprises the step of:

adding length to the traces of the bus until the pad-to-pad flight times of other signals equal the pad to pad flight of the signal having the greatest pad-to-pad flight time.

31. The method of claim 30 further comprising the step of:

increasing the clock speed of the bus until the setup margins of the first and second ICs are minimized.

32. A method for optimizing traces of a bus of a mounting surface, the method comprising the steps of:

simulating a position of a first, a second, and a third IC to minimize a trace route of a signal having the largest pad-to-pad flight time between the first and second ICs and between the third and second ICs while maintaining equal routing distances between the first and second ICs and between the third and second ICs;

computing a trace route of the bus for the signal that corresponds to the largest pad-to-pad flight time;

equalizing pad-to-pad flight times associated with signals, other than the signal associated with the largest pad-to-pad flight time, with the largest pad-to-pad flight time; and calculating an offset to be produced in a clock of the bus that is provided to the second IC, said offset equalizing setup margins of the ICs.

33. The method of claim 32, wherein the simulating step further comprises the steps of:

identifying a signal transmitted between the first IC and the second IC and between the second IC and the third IC having the longest combined package delay;

simulating the position of the first, second and third IC so as to minimize the routing distance of the signal having the longest combined package delay;

routing signals, other than the signal associated with the longest combined package delay, between said first, second and third IC so as to minimize the routing distances of the routed signals.

34. The method of claim 33, wherein the step of equalizing the pad-to-pad flight times comprises the step of:

adding length to the traces of the bus until the routed signals have pad-to-pad flight times equal to the largest pad-to-pad flight time.

35. The method of claim 34, further comprising the step of:

adjusting the clock speed of the bus until the setup margins of the ICs are minimized.

36. A method for wiring ICs on a PCB, said method comprising the steps of:

defining a first pin-to-pin trace between a pin of a first IC and a pin of a second IC;

calculating a pad-to-pad flight time of said first pin-to-pin trace;

defining a second pin-to-pin trace between another pin of the first IC and another pin of the second IC; and calculating a length of the second pin-to-pin trace such that the pad-to-pad flight time associated with the second pin-to-pin trace is equal to the pad-to-pad flight time of the first pin-to-pin trace.

37. A method for wiring ICs on a PCB as claimed in claim 36, said method further comprising the step of offsetting a clock of one IC in order to equalize setup margins.

38. An apparatus for wiring ICs on a PCB, said apparatus comprising:

first logic configured to define a first pin-to-pin trace between a pin of a first IC and a pin of a second IC;

second logic configured to calculate a pad-to-pad flight time of said first pin-to-pin trace;

third logic configured to define a second pin-to-pin trace between another pin of the first IC and another pin of the second IC; and fourth logic configured to calculate a length of the second pin-to-pin trace such that the pad-to-pad flight time of the second pin-to-pin trace is equal to the pad-to-pad flight time of the first pin-to-pin trace.

39. An apparatus for wiring ICs on a PCB as claimed in claim 38, said apparatus further comprising fifth logic configured to offset a clock of one IC in order to equalize setup margins.

* * * * *